United States Patent
Seidel et al.

(10) Patent No.: US 12,307,334 B2
(45) Date of Patent: May 20, 2025

(54) METHOD AND DEVICE FOR EVALUATING A STATISTICALLY DISTRIBUTED MEASURED VALUE IN THE EXAMINATION OF AN ELEMENT OF A PHOTOLITHOGRAPHY PROCESS

(71) Applicant: Carl Zeiss SMT GmbH, Oberkochen (DE)

(72) Inventors: Dirk Seidel, Jena-Leutra (DE); Alexander Freytag, Erfurt (DE); Christian Wojek, Aalen (DE); Susanne Töpfer, Gleina (DE); Carsten Schmidt, Jena (DE); Christoph Husemann, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1077 days.

(21) Appl. No.: 17/140,250

(22) Filed: Jan. 4, 2021

(65) Prior Publication Data
US 2021/0158215 A1  May 27, 2021

Related U.S. Application Data
(63) Continuation of application No. PCT/EP2019/068067, filed on Jul. 5, 2019.

(30) Foreign Application Priority Data
Jul. 5, 2018 (DE) .......................... 102018211099.9

(51) Int. Cl.
*G06N 20/20* (2019.01)
*G03F 7/00* (2006.01)
(Continued)

(52) U.S. Cl.
CPC ............. *G06N 20/00* (2019.01); *G03F 7/705* (2013.01); *G06F 17/18* (2013.01); *G06N 20/20* (2019.01)

(58) Field of Classification Search
None
See application file for complete search history.

(56) References Cited

U.S. PATENT DOCUMENTS

2005/0127292 A1   6/2005  Kang et al.
2006/0189009 A1   8/2006  Ahn et al.
(Continued)

FOREIGN PATENT DOCUMENTS

DE  102007047924   3/2013   ............. G01B 11/03
JP  2005-174929    6/2005   ............. H01J 37/28
(Continued)

OTHER PUBLICATIONS

The Notice of Reasons for Rejection issued by the Korean Intellectual Property Office for Application No. KR 10-2021-7003567, dated Oct. 12, 2022 (with English Translation).
(Continued)

*Primary Examiner* — Xuyang Xia
(74) *Attorney, Agent, or Firm* — Fish & Richardson P.C.

(57) ABSTRACT

The present invention relates to a method for evaluating a statistically distributed measured value in the examination of an element for a photolithography process, comprising the following steps: (a) using a plurality of parameters in a trained machine learning model, wherein the parameters characterize a state of a measurement environment in a time period assigned to a measurement of the measured value; and (b) executing the trained machine learning model in order to evaluate the measured value.

25 Claims, 7 Drawing Sheets

(51) Int. Cl.
　　*G06F 17/18*　　(2006.01)
　　*G06N 20/00*　　(2019.01)

(56) References Cited

U.S. PATENT DOCUMENTS

| | | | |
|---|---|---|---|
| 2007/0081134 A1 | 4/2007 | Amano | |
| 2008/0151268 A1 | 6/2008 | Archie et al. | |
| 2008/0202201 A1 | 8/2008 | Boesser et al. | |
| 2014/0195194 A1* | 7/2014 | Brill | H01L 22/00 702/155 |
| 2015/0241871 A1* | 8/2015 | Yoshino | G05B 19/0423 702/81 |
| 2016/0148850 A1 | 5/2016 | David | |
| 2016/0258879 A1* | 9/2016 | Liang | G01N 21/9501 |
| 2017/0109646 A1 | 4/2017 | David | |
| 2018/0067900 A1 | 3/2018 | Mos et al. | |
| 2018/0279932 A1* | 10/2018 | Boone | A61B 5/0031 |
| 2019/0178788 A1* | 6/2019 | Nguyen | G01B 11/0641 |

FOREIGN PATENT DOCUMENTS

| | | | | |
|---|---|---|---|---|
| JP | 2007-103882 | | 4/2007 | H01L 21/027 |
| JP | 2017-536584 | | 12/2017 | G03F 9/00 |
| KR | 1020140057312 | | 5/2014 | H01L 21/66 |
| TW | 201723709 A | * | 7/2017 | G03F 7/70508 |
| WO | WO 2016/096309 | | 6/2016 | G06N 99/00 |
| WO | WO 2017/087653 | | 5/2017 | G03F 7/20 |
| WO | WO 2017/117568 | | 7/2017 | G06N 99/00 |
| WO | WO 2017/117573 | | 7/2017 | G01N 21/95 |
| WO | WO 2017/120253 | | 7/2017 | G06T 3/40 |
| WO | WO 2017/123555 | | 7/2017 | H01L 21/66 |
| WO | WO 2017/123561 | | 7/2017 | H01L 21/66 |
| WO | WO 2017/194289 | | 11/2017 | G03F 7/20 |
| WO | WO 2017/205537 | | 11/2017 | G01N 21/95 |
| WO | WO 2018/072980 | | 4/2018 | G03F 7/70 |
| WO | WO 2018/075814 | | 4/2018 | G05B 19/418 |

OTHER PUBLICATIONS

The International Search Report for International Application No. PCT/EP2019/068067 dated Oct. 23, 2019.

The German Office Action for German Application No. DE 10 2018 211 099.9, dated Jul. 4, 2019.

Robinson, J.C et al., "Improved overlay control using robust outlier removal methods", *Proceedings of SPIE*, vol. 7971, pp. 79711G-1-79711G-10.

Schmitt-Weaver, E., et al. "Overlay Improvements Using a Real Time Machine Learning Algorithm," *Proceedings of SPIE*, vol. 9050, pp. 90501S-1-90501S-7 (2014).

The Notification of Reasons for Refusal and Search Report issued by the Japanese Patent Office for Application No. JP 2021-500173, dated Feb. 24, 2022 (with English Translation).

Notice of Allowance issued by the Chinese Patent Office for Application No. CN 201980045278.1 dated Mar. 3, 2025 (with English Machine Translation).

* cited by examiner

METHOD AND DEVICE FOR EVALUATING A STATISTICALLY DISTRIBUTED MEASURED VALUE IN THE EXAMINATION OF AN ELEMENT OF A PHOTOLITHOGRAPHY PROCESS

CROSS REFERENCE TO RELATED APPLICATIONS

This application is a continuation of and claims priority under 35 U.S.C. § 120 from PCT Application No. PCT/EP2019/068067, filed on Jul. 5, 2019, which claims priority from German Application No. 10 2018 211 099.9, filed on Jul. 5, 2018. The entire contents of each of these priority applications are incorporated herein by reference.

TECHNICAL FIELD

The present invention relates to a method and a device for improving the measurement accuracy of measuring devices used in the field of the semiconductor industry. In particular, the present invention relates to a method and a device for evaluating a statistically distributed measured value in the examination of an element of a photolithography process.

BACKGROUND

As a consequence of the growing integration density in the semiconductor industry, photolithography masks have to image increasingly smaller structures onto wafers. The advancing miniaturization of structures on wafers and thus also on the pattern-bearing elements used for the exposure of the wafers, such as, for instance, photolithographic masks or templates for nanoimprint lithography, has far-reaching effects on inspection, metrology and verification of the pattern-bearing elements. Modern measuring devices or tools used for monitoring and repairing photolithographic masks, templates and/or wafers during the processes for producing same are very complex in order to take account of the extremely stringent requirements made of accuracy in the semiconductor industry.

Examples of such measuring devices for the process for producing photolithographic masks, photomasks or just masks are inspection tools for detecting defects present on photomasks, metrology tools for measuring the critical dimension (CD) and positioning errors of pattern elements (for instance a WLCD tool or a PROVE® tool), verification tools for determining whether a defect of a mask is visible on a wafer (for instance an AIMS™ tool), mask repair tools (for example an MeRiT® tool) and phase measurement tools.

In a new approach, attempts are currently being made to tackle a number of challenges in the quality assessment of photomasks with the aid of a machine learning (ML) model. The following documents shall be cited by way of example for this procedure: WO 2017/087653 A1, WO 2017/117568 A1, WO 2017/120253 A1, WO 2017/123555 A1, WO 2017/123561 A1, WO 2017/117573 A1, WO 2017/123555 A1 and WO 2017/205537 A1.

The patent specification DE 10 2007 047 092 B4 describes a method for automatically detecting incorrect measurements by use of quality factors directly after their measurement. The incorrect measurement detected is rejected and replaced by a new measurement that satisfies the quality factors.

Establishing the quality factors of a measurement for the high-precision measuring devices mentioned above is a complex process since the relationship between the quality factors and the associated measurement for high-precision, complex tools is generally not known.

The present invention therefore addresses the problem of specifying a method and a device which increase the measurement accuracy of measuring devices and at least partly avoid the disadvantages described above.

SUMMARY

In accordance with one aspect of the present invention, this problem is solved by use of a method as claimed in claim 1 and a device as claimed in claim 17. In one embodiment, the method for evaluating a statistically distributed measured value in the examination of an element for a photolithography process comprises the following steps: (a) using a plurality of parameters in a trained machine learning model, wherein the parameters characterize a state of a measurement environment in a time period assigned to a measurement of the measured value; and (b) executing the trained machine learning model in order to evaluate the measured value.

The method according to the invention makes it possible, on the basis of parameters characterizing the measurement environment, to indicate automatically before, during or after a measurement how a planned or a recorded measured value will be or is positioned in its statistical distribution. The significance of a measured value can thus be evaluated already before, during or directly after the measurement of said measured value. By initiating suitable countermeasures, the method according to the invention thus enables the measurement accuracy of high-precision complex measuring devices to be increased significantly.

The method according to the invention can detect arbitrary unknown relationships between the measurement data and the parameters characterizing the measurement environment and utilize them for evaluating measured values. This is a crucial advantage of the method described here since, in the case of very accurate, complex measuring devices, the causality between measurement data, firstly, and the parameters characterizing the measurement environment is generally not known.

The measured value and the parameters characterizing the measurement environment should ideally be measured at the same "point in time." In a real measuring device, a measurement of a measured value does not take place at one point in time, but rather within a time interval. This means that a time period is assigned to the measurement or the recording of a measured value or the measurement or the recording of a measured value is correlated with a time period. The characterizing parameters should characterize the measurement environment within the time period assigned to the measurement. However, this does not mean that a measurement must be performed for every characterizing parameter within the correlated time period. A characterizing parameter that is subject to rapid variation should be measured once or even a plurality of times within the time period assigned to a planned measurement. By contrast, for a characterizing parameter that is subject only to a slow drift, it may be sufficient to perform a measurement in a time interval which is greater than the time period assigned to the planned measurement.

The measured value can be evaluated on the basis of a quality criterion. The quality criterion can comprise at least one element from the following group: a threshold value with regard to an expected value of a statistical distribution assigned to the measured value, an assignment to one range of a plurality of ranges predefined for the statistical distribution of the measured value, and a deviation of the measured value from the expected value of the statistical distribution.

A quality criterion can classify a measured value. The classification of the measured value can be binary, i.e. a measured value does or does not satisfy a requirement. A binary classification of a measured value can be effected on the basis of a threshold value. However, the classification can also comprise a multi-class assignment of a measured value, i.e. a measured value may for example satisfy the quality criterion very well or satisfactorily well or may not satisfy it. In addition, it is possible for the quality criterion to define a quality parameter in the form of a continuous function. The quality parameter may be normalized or may not be normalized.

It is an aspect of a method according to the invention to enable a prediction about a relative repetition accuracy of a measurement.

The measured value can be evaluated before a planned measurement, and the method according to the invention can furthermore comprise the following step: Not performing the planned measurement of the measured value if the quality criterion is not satisfied in the time period assigned to the planned measurement of the measured value.

It is an important advantage of the method described in this application that already before a measurement is performed, it is possible to determine whether or not the measurement environment, at the planned point in time for measurement, is in a state that is favorable for performing a measurement. It thereby becomes possible to increase the measurement accuracy of a device and at the same time to increase the measurement complexity only slightly, but measured values to be rejected later are not even generated in the first place.

The method defined above can furthermore comprise the following step: deferring the planned measurement until the quality criterion is satisfied in the time period assigned to the planned measurement of the measured value.

For efficiency reasons, it is more favorable to perform only usable measurements, instead of subsequently identifying unusable measured values, rejecting them and replacing them by a new measurement.

The measured value can be evaluated after it has been measured, and the method according to the invention can furthermore comprise the following step: rejecting the measured value if the quality criterion was not satisfied in the time period assigned to the planned measurement of the measured value.

It is also possible to implement the method presented in this application such that firstly a measurement is performed and then the measured value recorded is analyzed or evaluated.

The trained machine learning model can track the measurement or data recording of a measuring device and constantly monitor, i.e. measure, all essential characterizing parameters. The characterizing parameters are provided to the trained machine learning model as input data and the trained model predicts a value or a numerical value for the quality criterion. The statement of the trained model can then be used to initiate or defer the measurement of a measured value. The outputting of the quality criterion by the machine learning model can have the effect that a measuring device rejects the measured value recorded last and performs a renewed or a repeat measurement.

The method according to the invention can furthermore comprise the following step: producing a confidence statement with respect to the measured value. The confidence statement can be transferred together with the measured value of the measuring device.

The confidence statement reflects how the ML model assesses its output data in respect of reliability. By way of example, a measured value evaluated as an outlier with a confidence statement of 95% would result in this measured value being rejected. By contrast, an assessment that the measured value satisfies the quality criterion to the extent of 51% would result in it being maintained or measured anew, depending on the application. A method according to the invention can predict both a statement about the quality criterion being satisfied or not satisfied and a confidence statement with respect to the quality criterion. However, it is also possible for the confidence statement to be determined subsequently and externally to the machine learning model, from the output data thereof.

A feature of the element for a photolithography process can comprise a pattern element of a photomask or of a wafer and/or an alignment marking of the photomask or of the wafer.

The confidence statement of the measured value depends for example on the type of illumination of the feature on which the measurement is based. This means that a measurement of a pattern element and/or of an alignment marking of a photomask in reflection (i.e. using reflected light) or in transmission (i.e. using transmitted light) influences the confidence statement of the measured pattern element and/or of the measured alignment marking.

Furthermore, the confidence statement of the measured value can be independent of the illumination intensity and/or a measurement position on the element for the photolithography process.

In addition, the method according to the invention can comprise the following step: producing a warning and/or an error message by use of the measuring device on account of the confidence statement of one or more measured values. The ML model can thus indicate that it cannot assess the situation reliably. A human expert can intervene in the process on account of the warning and/or error message output.

The method according to the invention can comprise the following step: Stopping the measuring device on account of the confidence statement of one or more measured values. By terminating the further measurement data recording by the measuring device, it is possible to avoid the generation of worthless measured values.

The characterizing parameters can comprise two or more elements from the following group: temperature of the measurement environment, pressure of the measurement environment, air humidity of the measurement environment, refractive index of the measurement environment, focus position of a device for measuring the measured value, wavelength of an optical system of the device, exposure intensity of the optical system of the device, exposure setting of the optical system of the device, degree of coherence of the optical system of the device, detector settings of the device, settings of one or more interferometers of the device, settings of one or more damping systems of the device, and settings of one or more drives of the device.

The parameters characterizing the measurement environment comprise both the ambient conditions at the measurement location or in the immediate vicinity of the measurement location and the settings of the measuring device which carries out the measurement.

The characterizing parameters can comprise a temporal development of their numerical values.

The characterizing parameters can comprise not just measured values or numerical values in the time range assigned to a measurement, but rather can introduce the recent development of their numerical values into the method explained above. Taking account of the temporary development of the numerical values of the characterizing parameters can contribute to improved evaluation of an existing measured value and/or of a measured value yet to be measured.

The measured value can comprise a plurality of measurement recordings. The plurality of measurement recordings can comprise at least one changed characterizing parameter.

A measured value can comprise the repeated measurement, for example of a position of a pattern element and/or of a critical dimension (CD) at a specific location of a photolithographic mask. The measurement data of the progressive measurements or measurement recordings are then combined to form a measured value or measurement point. If a measured value comprises a plurality of measurement recordings, the time range correlated with or assigned to a measurement is typically significantly greater, compared with the time range assigned to or correlated with a measured value if the measured value is based on a single measurement.

The repeated measurement can be effected under substantially identical conditions, i.e. without one of the parameters characterizing the measurement environment being intentionally changed. However, it is also possible for one or more of the characterizing parameters to be changed in a defined way for the individual measurement recordings. By way of example, the exposure setting, a focus setting and/or a degree of coherence of the exposure of a location of a photomask can be set individually for the individual measurement recordings.

The plurality of measurement recordings can comprise measuring a focus stack. Furthermore, the confidence statement of the measured value of the focus stack can be independent of a number of recordings of the focus stack.

At least one of the characterizing parameters can comprise at least one characteristic variable of its static distribution during the plurality of measurement recordings for the measured value.

If, as described above, recording a measured value comprises repeatedly measuring a variable, the characterizing parameters are subject to a statistical fluctuation in the time period in which the measurement recordings are performed. Instead of the characterizing parameters being determined only as main points in the time period of the measurement recordings, it is also possible to measure the characterizing parameters repeatedly, for example periodically, in the time interval and to determine the statistical distribution of the measured numerical values in the time interval. As a result, the accuracy of the characterizing parameters can be increased.

The machine learning model can comprise at least one element from the following group: a kernel density estimator, a statistical model, a decision tree, a linear model, a time-variant model, a nearest neighbor classification, and a k-nearest neighbor algorithm, and their nonlinear extensions with nonlinear feature transformations.

A kernel density estimator (referred to as: KDE) enables a continuous estimation of an unknown probability distribution on the basis of random samples. Kernel density estimators can comprise for example a Gaussian kernel, a Cauchy kernel, a Picard kernel or an Epanechnikov kernel, wherein the kernel parameters contained in the machine learning model, such as the bandwidth, for instance, can be allocated or estimated individually or jointly for all input parameters. Generally, it is possible to use any similarity function that leads the input parameters present to a valid kernel function.

The statistical model can comprise at least one mixture distribution. A mixture distribution can comprise an element from the following group: a Gaussian mixture distribution (GMM, Gaussian mixture model), a multivariant normal distribution and a categorical mixture distribution. The suitable number of mixture distributions depends on the data present and can be optimized with the aid of a validation data set.

The decision tree (DT) can comprise at least one element from the following group: a conventional decision tree (DT), a randomized decision tree (RDT) and a decision forest (DF) and the latter's randomized variant (RDF). In RDTs and RDFs, the extent or "level" of the randomization can vary. For each node all or only a random selection of possible decisions can be present in the training. For each leaf of a decision tree all or only a subset of the training examples present up until then can be used.

The linear model can comprise at least one element from the following group: a latent Dirichlet allocation (LDA), a support vector machine (SVM), a logistic regression, a least square method (least square estimation), a Lasso regression, a Ridge regression, and a perceptron. An advantageous application of a linear model requires a normalization of the input data and the training data.

The machine learning model can comprise a nonlinear extension of an SVM in the form of a kernel support vector machine. Furthermore, the machine learning model can comprise a nonlinear extension of the Gaussian mixture distribution in the form of a Gaussian process regression. The machine learning model can moreover comprise a deep neural network (DNN).

The time-variant model can comprise at least one element from the following group: a recurrent neural network and a hidden Markov model. In an alternative exemplary embodiment, a time-variant model can be simulated by a time-invariant model by the parameters of an earlier measurement being made available to the time-invariant model as input data.

Time-variant or time-dependent machine learning models make it possible to take account of the temporal profile of the parameters characterizing the measurement environment.

In recurrent neural networks (RNNs), the outputs of a layer are incorporated into the same layer as additional inputs at a later point in time. One preferred embodiment of RMMs are LSTM (Long Short-Term Memory) networks.

Furthermore, the machine learning model can comprise two or more different types of machine learning model from the group specified above. A machine learning model which uses an ensemble or a group of a plurality of different types of model or a plurality of learning algorithms can generally achieve better results than an ML model which is based on a single type of model or learning algorithm. The calculation of the results of the number of different types of model typically takes longer than the evaluation of a single type of ML model. In return, however, a result corresponding to an ML model having one type of ML model or one learning algorithm can already be achieved with a smaller computation depth.

The predictions of the different constituents of the combination can contribute to the prediction of the machine learning model in an equally weighted manner. The predictions of the different types of ML model can contribute to the prediction of the machine learning model in a weighted manner.

A machine learning model which comprises a group of different types of ML model can be built up incrementally in the training phase by each type of model that is newly added to the group being provided with, in particular, the training data that the previous types of model in the group could not predict or could predict only poorly.

The two or more different ML model types of a machine learning model can be selected with the aid of automated machine learning (Automated Machine Learning or AutoML).

The hyperparameters of the machine learning model and/or the different ML model types of the machine learning model can likewise be optimized with the aid of automated machine learning. Hyperparameters of machine learning models are model parameters that are defined before the beginning of the training phase for the machine learning model.

A training data set for training the machine learning model can comprise data pairs: characterizing parameters of an i-th measured value and the quality criterion of the i-th measured value.

A training data set for training the machine learning model can comprise data pairs: characterizing parameters of an i-th measured value at a j-th position of the element of the photolithography process and the quality criterion of the i-th measured value at the j-th position of the element of the photolithography process.

As already explained above, the quality criterion can comprise satisfying a threshold condition for the measured value, an assignment of the measured value to one range or a class of a plurality of ranges or classes or a numerical value of a continuous function.

The method according to the invention can furthermore comprise the following step: Adapting the trained machine learning model to a modification of the measuring device that performs the measurement.

After maintenance and/or an exchange of parts of the measuring device, the trained machine learning model can be adapted to the modified measuring device by use of a relearning process with a new or second training data set.

Moreover, the method according to the invention can comprise the following step: Adapting the trained machine learning model to a location-specific installation of the measuring device.

A trained model can be adapted to a location-specific installation of a measuring device with the aid of a second training data set. The complexity for an adaptation process or a relearning process depends on the chosen realization of the machine learning model. By way of example, for an adaptation process it may be necessary also to have in storage the training data of the first training data set and to make them available to the relearning process. Furthermore, the complexity or the computational complexity is dependent on the realization chosen for the machine learning model.

A computer program can comprise instructions which, when they are executed by a computer system, cause the computer system to perform the method steps of one of the methods described above.

In one embodiment, the device for evaluating a statistically distributed measured value in an examination of an element for a photolithography process comprises: (a) means for using a plurality of parameters in a trained machine learning model, wherein the parameters characterize a state of a measurement environment in a time period assigned to a measurement of the measured value; and (b) means for executing the trained machine learning model in order to evaluate the measured value.

The device according to the invention can furthermore comprise means for performing the measurement.

The means for performing the measurement can comprise: a source for generating a particle beam and a detector for detecting particles coming from the element of the photolithography process.

The particle beam can comprise at least one element from the following group: a photon beam, an electron beam, an ion beam, an atomic beam and a molecular beam, and/or the detector can comprise at least one element from the following group: a photomultiplier, a photodiode, an avalanche photodiode, a CCD camera and an x-ray detector.

The device according to the invention can furthermore comprise means for determining the characterizing parameters and/or means for changing the characterizing parameters.

Moreover, the device according to the invention can comprise means for deferring the planned measurement and/or means for rejecting a measured value.

The element of the photolithography process can comprise at least one element from the following group: a photolithographic mask, a template for nanoimprint lithography and a wafer.

DESCRIPTION OF DRAWINGS

The following detailed description describes currently preferred exemplary embodiments of the invention, with reference being made to the drawings, in which.

DETAILED DESCRIPTION

Currently preferred embodiments of the method according to the invention and of the device according to the invention are explained in more detail below on the basis of evaluating measured values of a photolithographic mask. The method according to the invention and the device according to the invention can be used for evaluating measured values of all types of transmissive and reflective photomasks. Furthermore, the method according to the invention and the device according to the invention can also be used for evaluating measured values which originate from a template for nanoimprint lithography and/or a wafer. However, the method according to the invention and the device according to the invention are not restricted to the application to elements for a photolithography process. Rather, they can generally be used for evaluating the measured values of high-precision measuring devices that yield a large amount of measurement data, such that a machine learning model can be trained therewith.

Figure 1:
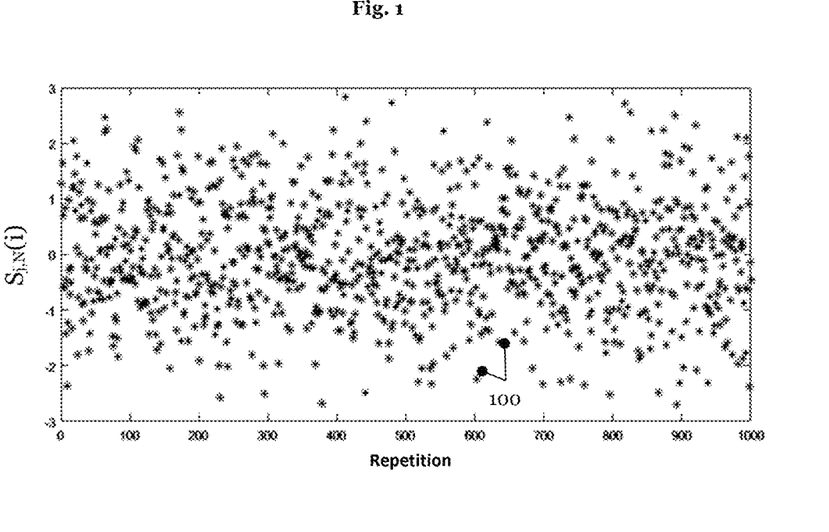
FIG. 1 represents an exemplary statistical distribution of measured values at a position on an element of a photolithography process.

FIG. 1 shows one example of a statistical distribution of a measured value 100 at a specific position of a photolithographic mask. In detail, FIG. 1 presents 1000 repetitions of the measurement of a measurement point 100 at a j-th location of the photomask, i.e. N=1000. By way of example, 200 measurement locations can be distributed over the photomask, i.e. M=200. The M measurement points can be distributed in a regular grid over the photolithographic mask. It is more expedient, however, to distribute the M measurement points among pattern elements and/or alignment markings of the photomask. In the example illustrated in FIG. 1, the M measurement points distributed over the photomask are measured successively. After all M measurement points have been measured once, this procedure is repeated N times. The abscissa in FIG. 1 thus represents a temporal development of the measured value 100 at a j-th location of the photolithographic mask during a measurement process.

The ordinate in FIG. 1 presents the measured values 100 $s_j(i)$ at the j-th position as a difference with respect to the expected value or mean value $<s_j>$ of the statistical distribution. In the example illustrated in FIG. 1, it holds true that: $1 \leq i \leq N=1000$ and $1 \leq j \leq M=200$. In addition, the measured values 100 $s_j(i)$ are presented in the manner normalized to a standard deviation $\sigma = s_j(i) - <s_j>$ from the expected value or mean value $<s_j>$, i.e. $s_{j,N}(i) = (s_j(i) - <s_j>)/\sigma$.

Figure 2:
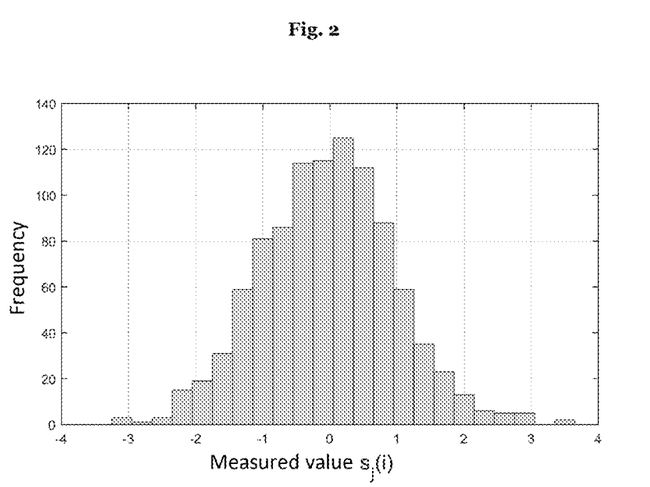
FIG. 2 presents a histogram with respect to the distribution of the measured values illustrated in FIG. 1.

FIG. 2 shows a histogram derived from the statistical distribution of the measured value 100 $s_j(i)$ or $s_{j,N}(i)$. A 3σ value, i.e. an interval of the statistical distribution in which 99.73% of all the measured values 100 are in a normal distribution, of 3σ=3 can be derived from FIG. 2.

Figure 3:
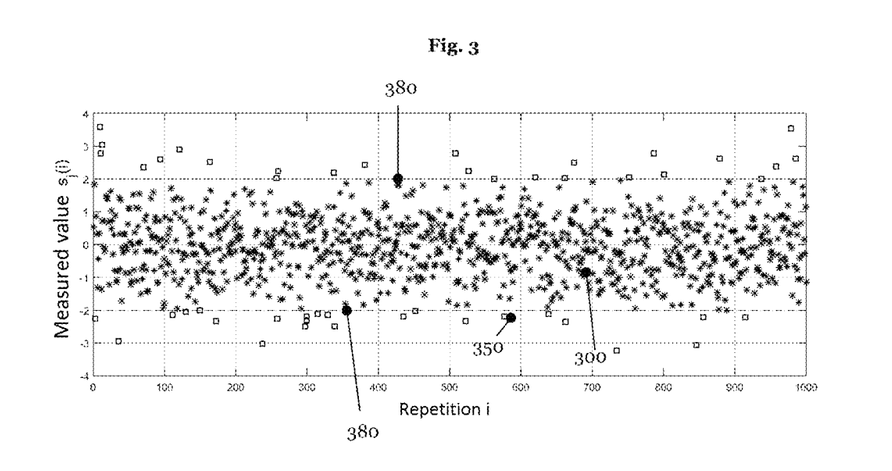
FIG. 3 shows the statistical distribution from FIG. 1 after the introduction of a threshold condition for identifying outliers of the measured values.

FIG. 3 shows FIG. 1 again with a dashed line 380 depicted for a normalized deviation of ±2σ. The dashed lines 380 realize a threshold condition for a measured value 100 $s_j(i)$ or $s_{j,N}(i)$. Measured values 100 of the statistical distribution which lie within the ±2σ interval are regarded as usable measured values 300, and measured values 100 which lie outside the ±2σ interval are regarded as outliers 350 and are rejected. In one procedure, with a normal distribution being present, 95.45% of all the measured values 100 are classified as "good" and the 4.55% of the measured values lying outside the dashed lines are classified as "poor". In the example illustrated in FIG. 3, out of 1000 measured values 100 49 measured values 350 lie outside the ±2σ range or interval.

Figure 4:
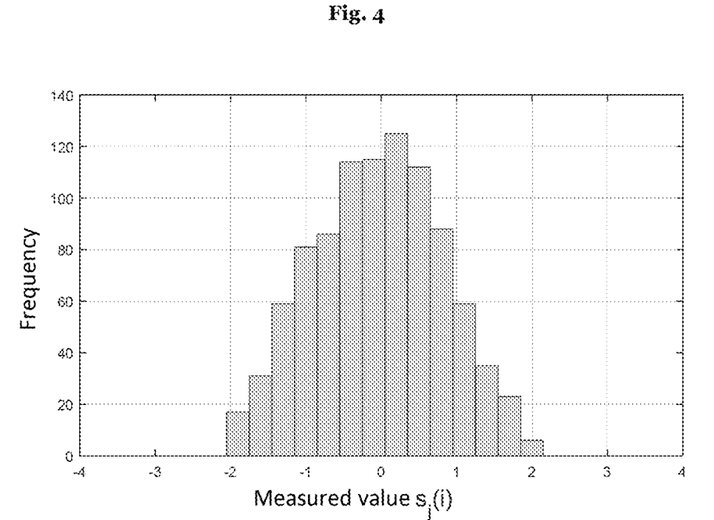
FIG. 4 illustrates a histogram of FIG. 3 after the removal of the measurement outliers that do not satisfy the threshold condition.

FIG. 4 presents a histogram for the measured values 300—lying within the range of ±2σ—of the statistical distribution of the measured values 100 $s_j(i)$ from FIG. 1. The maximum measurement error of the measured values 300 $s_j(i)$ or $s_{j,N}(i)$ was reduced from 3σ=3 in FIG. 1 to 3σ=2 in FIG. 3 by eliminating the outliers 350.

FIGS. 1 to 4 illustrate that after a measurement it is always possible to decide, on the basis of a statistical analysis of all the measured values 100, what are outliers 350 in the statistical distribution of the recorded measured values 100 $s_j(i)$, and thus to optimize the evaluation of a measurement and hence the accuracy of a measuring device. The method described in this application has the advantage, then, of making it possible, already before or during the performance of a planned measurement, to decide whether a planned measurement will yield a "good" measured value 300, i.e. a usable measured value 300, or else a "poor" measured value 350, i.e. an outlier 350. As a result, the measurement accuracy of a measuring device can be considerably increased, without appreciably impairing the throughput of the measuring device.

Figure 5:
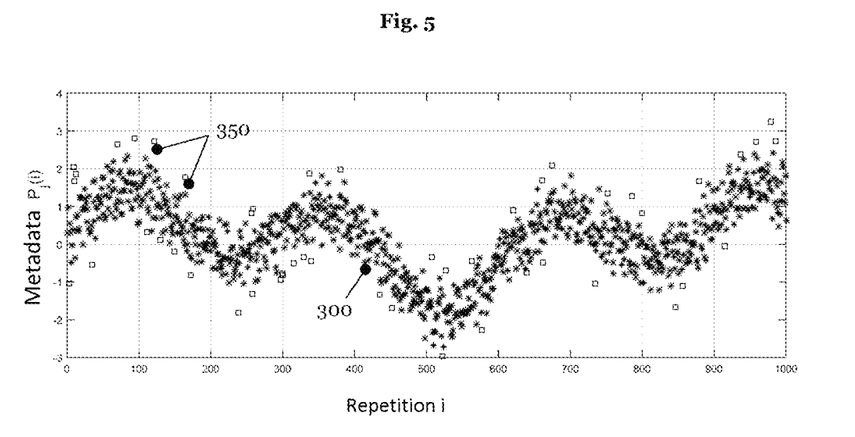
FIG. 5 shows a set of characterizing parameters which belongs to the distribution of measured values illustrated in FIG. 1 and in which the measurement outliers identified in FIG. 3 are identified.

FIG. 5 presents a set of characterizing parameters $P_j(i)$ which belongs to the statistical distribution of measured values $s_j(i)$ illustrated in FIG. 1. FIG. 5 presents one example of a possible temporal profile of characterizing parameters $P_j(i)$. In the set of the characterizing parameters $P_j(i)$, the outliers 350 in FIG. 5 are identified by "squares", in a manner similar to that in FIG. 3.

As can be gathered from FIG. 5, all the parameters $P_j(i)$ characterizing the measurement environment during the measurement of the measured values $s_j(i)$ or $s_{j,N}(i)$ are provided with the identification or annotation "good", namely lying within the ±2σ interval, or "poor", namely lying outside this range. The quality criterion, i.e. in the example in FIG. 4 the threshold condition used for separating "good" and "poor" measured values, can be chosen such that only very few measured values are to be characterized as outliers. As a result, the measurement accuracy of the measuring device is only slightly improved; in return, the time duration for performing the measurement by means of the device is only slightly increased. However, it is also possible to define the quality criterion such that the measurement accuracy of the measuring device can be significantly increased. This improvement is effected at the expense of the measurement time duration for the measurement of the statistical distribution of the measured values $s_j(i)$.

Besides a threshold condition, i.e. a binary classification, as illustrated in FIGS. 1 to 5, the quality criterion can also comprise a multi-class classification (not shown in FIG. 3). Furthermore, the quality criterion can be realized in the form of a continuous function (not illustrated in FIG. 3). It is advantageous to adapt both the machine learning model and the quality criterion to the problem to be solved.

Figure 6:
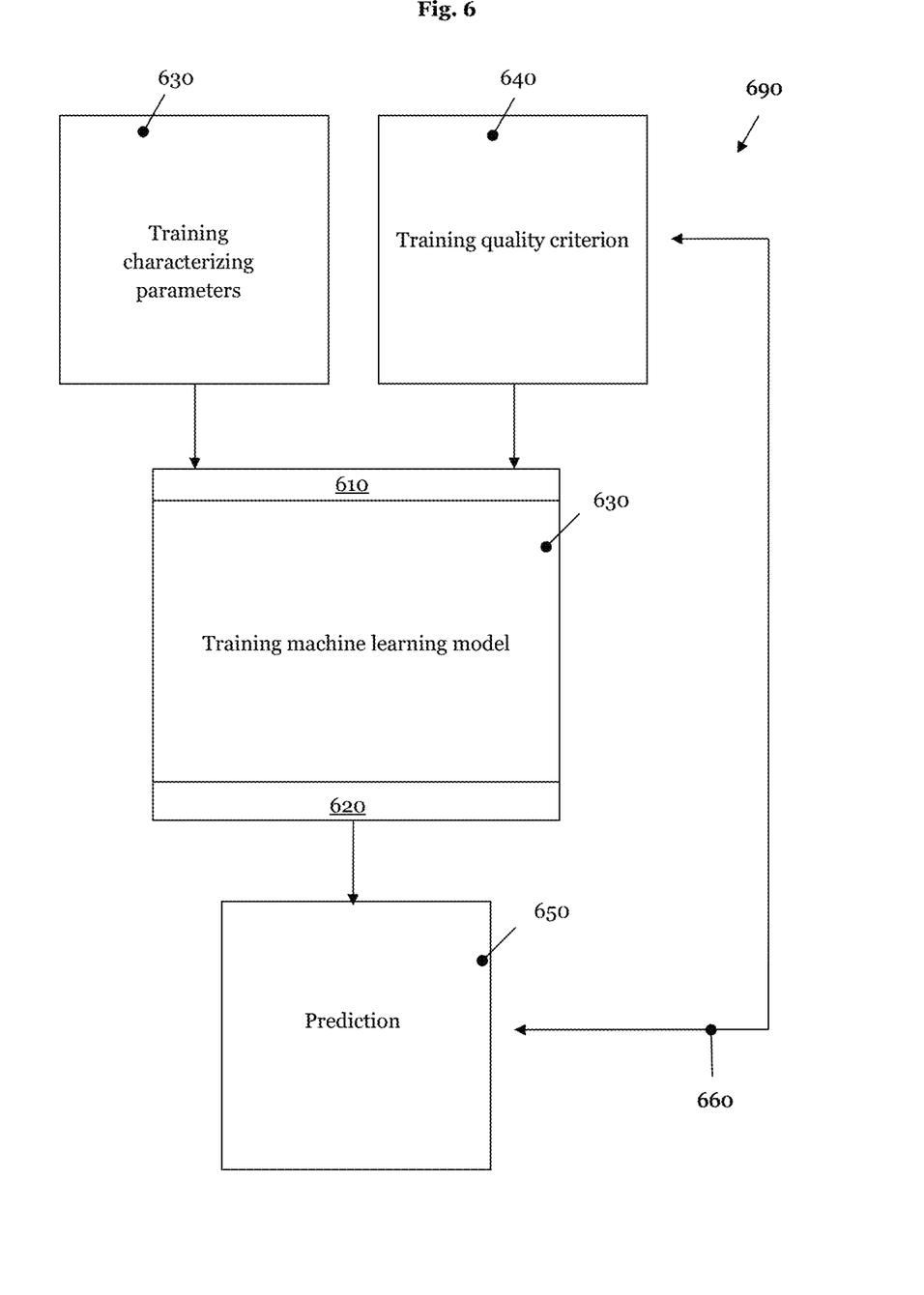
FIG. 6 schematically illustrates a training process of a machine learning model.

The diagram 690 in FIG. 6 schematically shows the training of a machine learning model 600 or of an ML model 600. Before the ML model 600 can predict the position of a measurement point 100, 300, 350 within its statistical distribution from the parameters characterizing the measurement environment, the ML model 600 must be trained with an extensive data set or training data set for this objective. The training data are generated by implementing long measurement series of identical type with a measuring device. By way of example, a measuring device, for instance a registration tool (e.g. PROVE®), is used to measure a photomask or a wafer n times repeatedly in an identical way, wherein n must be chosen with a magnitude such that the relevant characterizing parameters of the measuring device change significantly during the measurement process. Furthermore, it is possible to vary the measurement environment and thus the characterizing parameters systematically during the recording of training data, in order to generate as representative a database as possible for training purposes.

The training data set comprises the characterizing parameters 630 used for training and the quality criterion 640 associated with the characterizing parameters 630 used for training. The training data are provided to the training ML model 600 at an input layer 610. The quality criterion 640 indicates a classification of the characterizing parameters 630 used for training, i.e. in the simplest case indicates whether the characterizing parameters 630 used for training satisfy or do not satisfy a threshold condition 380. During the training phase, the training or learning ML model 600 generates a prediction 650 for the quality criterion 640 from the training characterizing parameters 630 and the associated quality criterion 640. The predicted quality criterion 650 is compared with the quality criterion 640 assigned to the measurement. This is illustrated by the double-headed arrow 660 in FIG. 6. The training ML model 600 provides the predicted quality criterion 650 at its output layer 620.

Depending on the ML model 600 chosen, there are various methods for adapting the parameters of the ML model 600 in the training phase. By way of example, the iterative technique "stochastic gradient descent" has become established for a DNN (deep neural network), which typically has a multiplicity of parameters. In this case, the training data are repeatedly "submitted" to the learning ML model 600, i.e. the latter calculates a prediction 650 for the quality criterion 640 from the characterizing parameters 630 used for training with its current parameter set. The comparison discussed above is carried out afterward. If deviations arise between the prediction 650 of the quality criterion 640 and the actual value of the quality criterion 640, the parameters of the learning ML model 600 are adapted. The training phase ends once a local optimum is reached, i.e. the deviations of the predicted quality criterion 650 and the actual quality criterion 640 no longer vary, or else a predefined time budget for the training cycle of the learning or training ML model 600 has been used up.

For most linear machine learning models, there exist closed calculation specifications for an optimum allocation of the model parameters, i.e. the determination of the model parameters of these models is not based on an iterative approximation. In order to determine the model parameters of decision trees, various split criteria can be selected, such as the gain of information, for example. Furthermore, the decision trees can also be pruned afterward, for example to a maximum depth and/or to a maximum diversity per leaf. An expectation maximization method or algorithm is normally used for mixture models, for instance Gaussian mixture models. For nearest neighbor models as well as for Parzen density estimation and kernel regression, model parameters do not have to be estimated, rather the hyperparameters of the kernel function are optimized.

Figure 8:
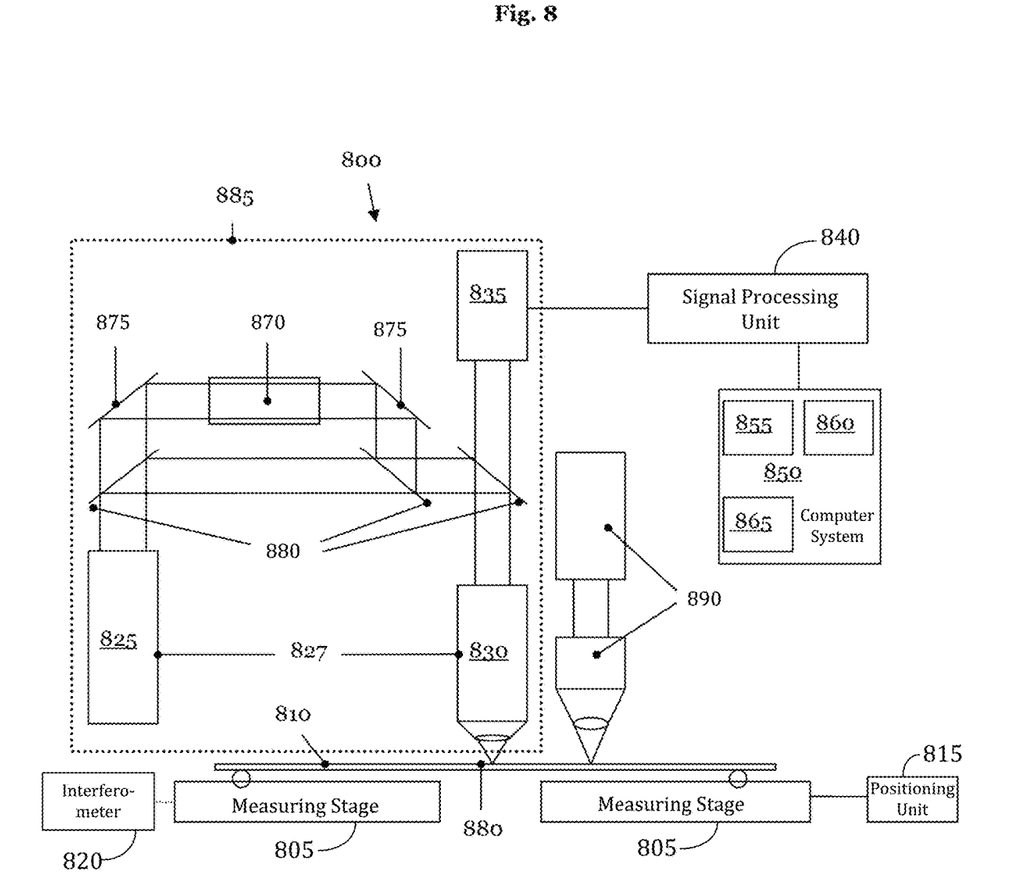
FIG. 8 schematically presents some components of a measuring device.

The characterizing parameters 630 used for training can originate from an optical measuring device, for example the measuring device 800 to be discussed in the context of FIG. 8. However, it is also possible to use the method described in this application for any measuring devices that generally use a particle beam for imaging an element of a photolithography process. In particular, the method explained here can be used for a scanning electron microscope and/or a measuring device that uses an ion beam for imaging a photomask or a wafer.

Figure 7:
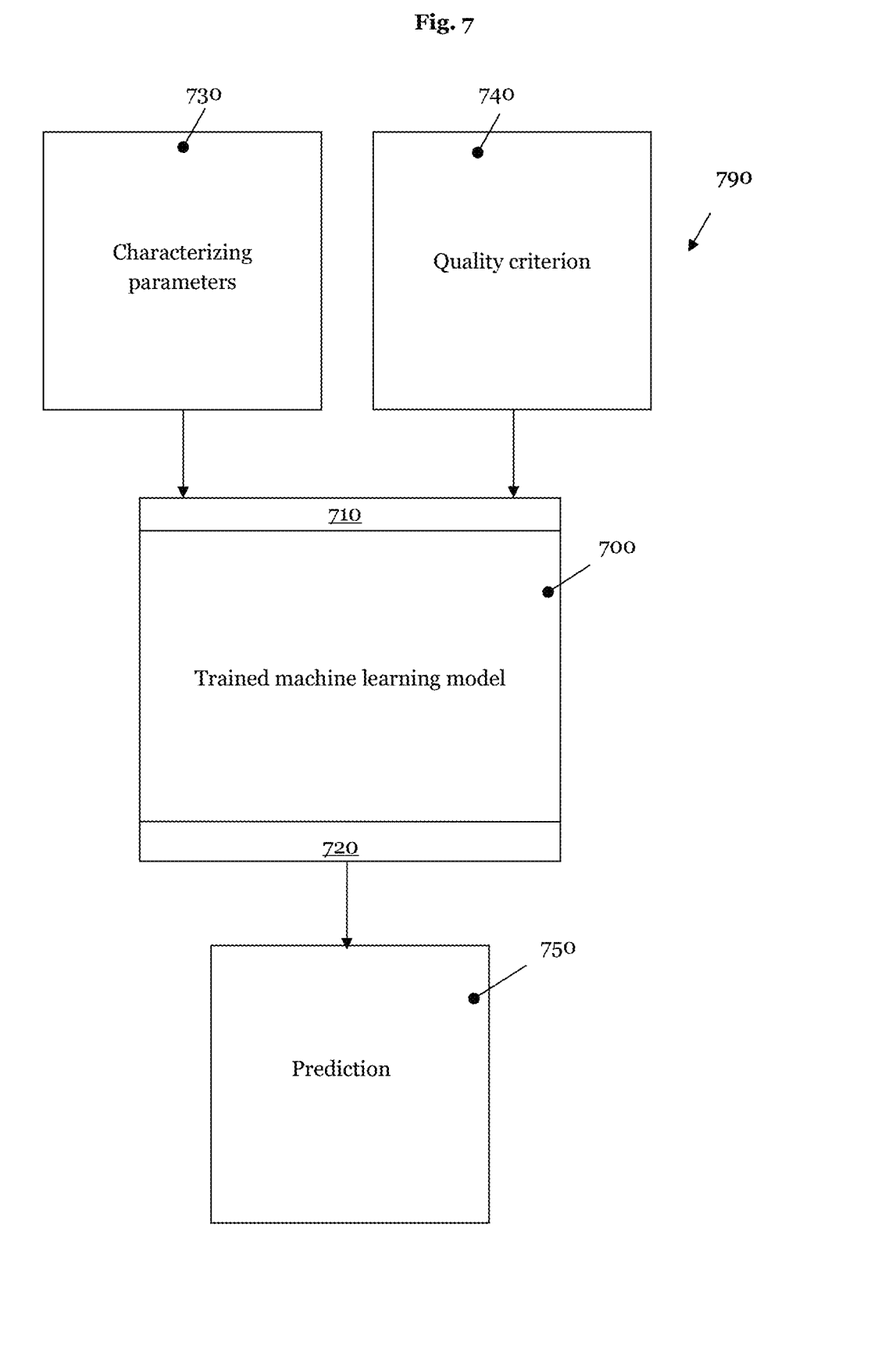
FIG. 7 schematically illustrates the execution of a machine learning model.

The diagram 790 in FIG. 7 schematically illustrates the execution of a trained ML model 700, which transforms characterizing parameters 730 measured by a measuring device and the quality criterion 740 assigned to the characterizing parameters 730 into a predicted quality criterion 750 for a measured value 100, 300, 350 of a measurement planned with the measuring device. The characterizing parameters 730 and assigned values of the quality criterion 740 are provided to the trained ML model 700 via the input layer 710. The trained machine learning model 700 yields at the output layer 720 a prediction of the quality criterion 750 of a measured value 100, 300, 350 of a measurement planned with the measuring device.

The ML model 700 can comprise one of the models described in the third section. It is advantageous to select, from a multiplicity of generic ML models available, a model adapted to the problem to be solved. Furthermore, it is expedient to adapt a selected generic ML model 700 to the problem to be solved and to the required prediction accuracy of the quality criterion 750. The ML model 700 can be adapted for example by use of an adaptation of the complexity of the kernel function of an ML model 700. In the case of an ML model having an encoder-decoder architecture, this can also be performed for example by use of a corresponding choice of the number of layers in the ML model. For an ML model 700 realized in the form of a mixture form described above, for example, for instance the number of leaves in an RDT or the number of trees in an RDF can be adapted to the problem to be solved.

FIG. 8 shows a section through a schematic diagram of a device 800 or of a measuring device 800, which can be used to measure positioning errors of structure or pattern elements of a photomask and/or of a wafer, the critical dimension of pattern elements, i.e. the CD (critical dimension) thereof, of masks and/or wafers and/or overlay errors when aligning masks of a mask stack. A photolithographic mask 810 or more generally an element 810 of a photolithography process is held by a high-precision measuring stage 805 or stage 805. In the example illustrated in FIG. 8, the photomask 810 is a reflective mask, for example a mask for the extreme ultraviolet (EUV) wavelength range. However, the measuring device 800 can also measure transmissive photomasks 810. The measuring stage 805 is actively controlled by a positioning unit 815 in all six degrees of freedom and, in the example illustrated in FIG. 8, is the only movable part of the measuring device 800. The position of the measuring stage 805 in the plane of the photomask 810, which is referred to as xy-plane below, is detected by one or more interferometers 820, for example by one or more laser interferometers. Furthermore, an interferometer 820 can be used to determine the position of the measuring stage 805 in the z-direction (not illustrated in FIG. 8).

An excimer laser generating light in the DUV (deep ultraviolet) wavelength range, for example an ArF (argon fluoride) laser which emits at a wavelength in the region of 193 nm, is used as a light source 825 in the measuring device 800. In the example illustrated in FIG. 8, the lens 830 has a numerical aperture (NA) of 0.6. However, it is possible to use a lens 830 with a greater NA in the measuring device 800 in order to increase the resolution capability of the measuring device 800. The laser radiation of the light source 825 is focused onto the surface of the mask 810 by moving the measuring stage 805 in the vertical direction or z-direction. The top side of the mask 810, which is the side of the mask 810 facing the lens 830, has pattern elements, which are not illustrated in FIG. 8.

A CCD (charge coupled device) sensor 835 forms a spatially resolving detector of the measuring device 800. The CCD sensor 835 measures the light which is locally reflected by the mask 810. Typically, a CCD sensor 835 comprises a two-dimensional pixel arrangement or a pixel array, for example 1000×1000 pixels. The CCD sensor 835 transmits the measurement signal thereof to the signal processing unit 840, which calculates an image from the signal detected by the CCD sensor 835. The exposure system 827 with, as essential components, light source 825 and lens 830, and the detector 835 form the optical system 885 of the measuring device 800.

A computer system 850 can display the image which was calculated by the signal processing unit 840 and/or it can store the measured data as raw data and/or as image data in a non-volatile memory 855. For reasons of clarity, the display of the computer system 850 is not illustrated in FIG. 8. A machine learning model 600 and/or a trained ML model 700 can be stored in the memory 855 of the computer system 850. Furthermore, characterizing parameters 630 used for training and assigned values of the quality criterion 640 can be stored in the memory 855. The computer system 850 comprises one or more processors 860 that train the ML model 600 and/or execute the trained ML model 700. The processor(s) can be embodied for example in the form of one or more powerful GPUs (graphics processing units).

An optimization unit 860 of the computer system 850 causes the signal processing unit 840 to perform or to defer a planned measurement of a measured value 100, 300, 350 by the optical system 885 of the measuring device 800.

Finally, an analysis unit 865 can analyze the measured values of the measuring device 800 and determine the characteristic variables of a statistical distribution of the measured values. Furthermore, the analysis unit 865 of the computer system 850 can classify planned measured values and measured values already measured.

The computer system 850 can be embodied as a separate unit, as illustrated in the example in FIG. 8. However, it is also possible for the computer system 850 and/or the signal processing unit 840 to be integrated (not shown in FIG. 8) into the measuring device 800.

The computer system 850 can monitor and/or control the positioning unit 815 of the measuring stage 805, the interferometer or interferometers 820, the light source 825, the lens 830, the CCD sensor 835, the signal processing unit 840, the analysis unit 865 and the optimization unit 860.

The surface of the photolithographic mask 810 can be slightly tilted. Moreover, a slight curvature of the mask 810 on account of the inherent weight thereof leads to a variation in the best focus condition. Therefore, the measuring device 800 has an autofocus (AF) system 870 on the basis of an oblique grid (not illustrated in FIG. 8). The tilted mirrors 875 and the partly transmissive mirrors 880 direct the laser beam onto the lens 830. Furthermore, the exemplary measuring device 800 in FIG. 8 comprises an optical auxiliary system 890 for roughly aligning the lens 830 with the pattern elements of the photomask 810.

If the mask 810 is a transparent mask, the light source 825 is directed from below onto the photomask 810 by a second lens and the lens 830 collects the laser radiation leaving the surface of the photomask 810 (not shown in FIG. 8).

Furthermore, the measuring device 800 comprises sensors that measure for example a pressure, a temperature and/or an air humidity in the measurement environment 880 (not illustrated in FIG. 8).

Figure 9:
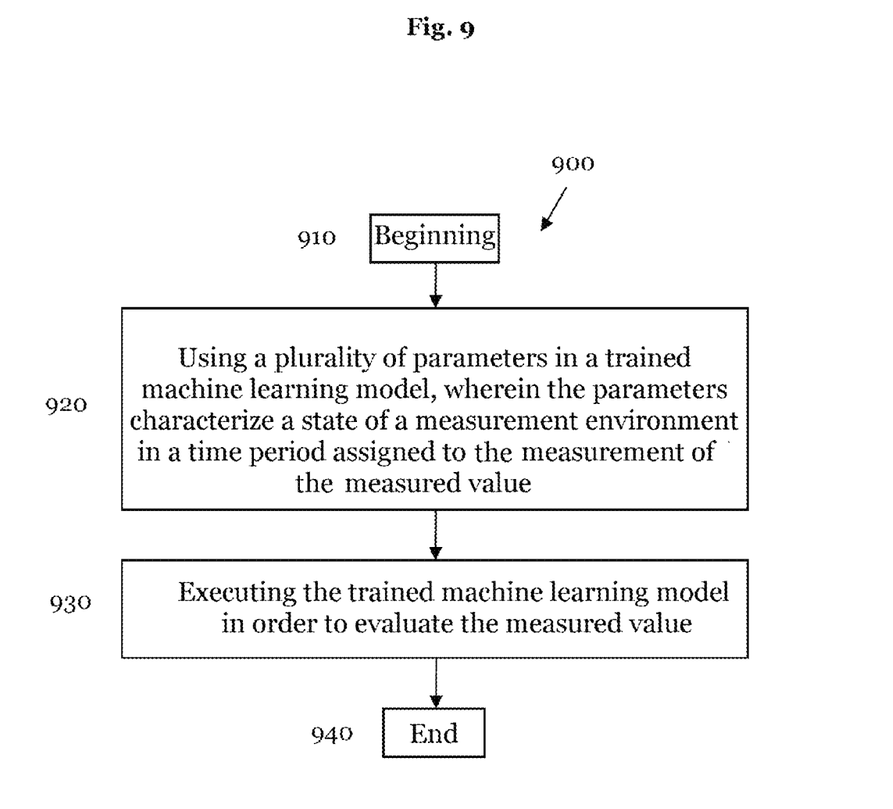
FIG. 9 shows a flow diagram of a method for evaluating a statistically distributed measured value in the examination of an element for a photolithography process.

Finally, FIG. 9 represents a flow diagram 900 of a method for evaluating a statistically distributed measured value 100, 300, 350 in the examination of an element 810 for a photolithography process. The method begins in step 910. In the first step 920, a plurality of parameters 730 characterizing a state of a measurement environment 880 in a time period assigned to a measurement of the measured value 100, 300, 350 are used in a trained machine learning model 700. The second step 930 then involves executing the trained machine learning model 700 in order to evaluate the measured value 100, 300, 350. The method finally ends in step 940.

What is claimed is:

1. A method of evaluating a statistically distributed value to be measured in an examination of an element for a photolithography process prior to its measurement for improving a measurement accuracy of the statistically distributed value to be measured, the method comprising the following steps:
   a. using a plurality of characterizing parameters in a trained machine learning model, wherein the plurality of characterizing parameters characterize a state of a measurement environment in a time period assigned to a measurement;
   b. executing the trained machine learning model in order to evaluate the time period assigned to the measurement of a value to be measured, wherein the measurement is to be carried out in the assigned time period, the trained machine learning model predicting a quality criterion for the assigned time period assigned to the measurement of the value to be measured, wherein the trained machine learning model has been trained with a training data set comprising N data pairs, wherein each data pair of the N data pairs comprises two or more of the plurality of characterizing parameters which characterize the state of the measurement environment at an i-th time period and the quality criterion associated with the two or more of the plurality of characterizing parameters at the i-th time period; and
   c. deferring the measurement of the value to be measured if the quality criterion predicted by the trained machine learning model indicates that a threshold is not met.

2. The method of claim 1, comprising performing the planned measurement if the quality criterion predicted by the trained machine learning model is satisfied in the time period associated with the planned measurement.

3. The method of claim 2, wherein the quality criterion comprises at least one element from the following group: a threshold value with regard to an expected value of a statistical distribution assigned to the value to be measured, an assignment to one range of a plurality of ranges predefined for the statistical distribution of the value to be measured, and a deviation of the value to be measured from the expected value of the statistical distribution.

4. The method of claim 2, wherein the value to be measured is evaluated before a planned measurement, and furthermore comprising the following step: not performing the planned measurement of the value to be measured if the quality criterion is not satisfied in the time period assigned to the planned measurement of the value to be measured.

5. The method of claim 4, furthermore comprising the following step: deferring the planned measurement until the quality criterion is satisfied in the time period assigned to the planned measurement of the value to be measured.

6. The method of claim 2, further comprising performing a measurement to obtain a measured value, evaluating the measured value after it has been measured, and furthermore comprising the following step: rejecting the measured value if the quality criterion was not satisfied in the time period assigned to the planned measurement of the measured value.

7. The method of claim 2, wherein a training data set for training the machine learning model comprises data pairs: characterizing parameters of an i-th measured value at a j-th position of the element of the photolithography process and the quality criterion of the i-th measured value at the j-th position of the element of the photolithography process.

8. The method of claim 1, furthermore comprising the following step: producing a confidence statement with respect to the measured value.

9. The method of claim 1, wherein the plurality of characterizing parameters comprise two or more elements from the following group: temperature of the measurement environment, pressure of the measurement environment, air humidity of the measurement environment, refractive index of the measurement environment, focus position of a device for measuring the statistically distributed value to be measured, wavelength of an optical system of the device, exposure intensity of the optical system of the device; exposure setting of the optical system of the device, degree of coherence of the optical system of the device, detector settings of the device, settings of one or more interferometers of the device, settings of one or more damping systems of the device, and settings of one or more drives of the device.

10. The method of claim 1, wherein the plurality of characterizing parameters comprise a temporal development of their numerical values.

11. The method of claim 1, wherein the value to be measured comprises a plurality of measurement recordings.

12. The method of claim 11, wherein the plurality of measurement recordings comprise at least one changed characterizing parameter.

13. The method of claim 12, wherein at least one of the plurality of characterizing parameters comprises at least one characteristic variable of its static distribution during the plurality of measurement recordings for the value to be measured.

14. The method of claim 1, wherein the machine learning model comprises at least one element from the following group: a kernel density estimator, a statistical model, a decision tree, a linear model, a time-invariant model, a nearest neighbor classification, and a k-nearest neighbor algorithm, and their nonlinear extensions with nonlinear feature transformations.

15. The method of claim 14, wherein the machine learning model comprises two or more different types of model of machine learning model from the group.

16. A computer program comprising instructions stored in a storage medium which, when they are executed by a computer system comprising one or more processors and the storage medium, cause the computer system to perform the method steps:
 a. using a plurality of characterizing parameters in a trained machine learning model, wherein the plurality of characterizing parameters characterize a state of a measurement environment in a time period assigned to a measurement;
 b. executing the trained machine learning model in order to evaluate the time period assigned to the measurement of a value to be measured, wherein the measurement is to be carried out in the assigned time period, the trained machine learning model predicting a quality criterion for the assigned time period assigned to the measurement of the value to be measured, wherein the trained machine learning model has been trained with a training data set comprising N data pairs, wherein each data pair of the N data pairs comprises two or more of the plurality of characterizing parameters which characterize the state of the measurement environment at an i-th time period and the quality criterion associated with the two or more of the plurality of characterizing parameters at the i-th time period; and
 c. deferring the measurement of the value to be measured if the quality criterion predicted by the trained machine learning model indicates that a threshold is not met.

17. A device for evaluating a statistically distributed value to be measured in an examination of an element for a photolithography process prior to its measurement for improving a measurement accuracy of the statistically distributed value to be measured, comprising:
 a. means for using a plurality of characterizing parameters in a trained machine learning model, wherein the plurality of characterizing parameters characterize a state of a measurement environment in a time period assigned to a measurement of the measured value;
 b. means for executing the trained machine learning model in order to evaluate the time period assigned to the measurement of a value to be measured, wherein the measurement is to be carried out in the assigned time period, the trained machine learning model predicting a quality criterion for the assigned time period assigned to the measurement of the value to be measured, wherein the trained machine learning model has been trained with a training data set comprising N data pairs, wherein each data pair of the N data pairs comprises two or more of the plurality of characterizing parameters which characterize the state of the measurement environment at an i-th time period and the quality criterion associated with the two or more of the plurality of characterizing parameters at the i-th time period; and
 c. means for deferring the measurement of the value to be measured if the quality criterion predicted by the trained machine learning model indicates that a threshold is not met.

18. The device of claim 17, furthermore comprising: means for performing the measurement.

19. The device of claim 18, wherein the means for performing the measurement comprises: a source for generating a particle beam and a detector for detecting particles coming from the element of the photolithography process.

20. The device of claim 17, furthermore comprising: means for determining the plurality of characterizing parameters and/or means for changing the plurality of characterizing parameters.

21. A device for evaluating a statistically distributed value to be measured in an examination of an element for a photolithography process prior to its measurement for improving a measurement accuracy of the statistically distributed value to be measured, the device comprising:
 one or more storage media storing instructions;
 a computer system comprising one or more processors and an optimization unit;
 wherein the one or more processors are operable to execute at least some of the instructions to use a plurality of characterizing parameters in a trained machine learning model, the plurality of characterizing parameters characterize a state of a measurement environment in a time period assigned to a measurement of the measured value;
 wherein the one or more processors are further operable to execute at least some of the instructions to execute the trained machine learning model in order to evaluate the time period assigned to the measurement of a value to be measured, wherein the measurement is to be carried out in the assigned time period, the trained machine learning model predicting a quality criterion for the assigned time period assigned to the measurement of the value to be measured, wherein the trained machine learning model has been trained with a training data set comprising N data pairs, wherein each data pair of the N data pairs comprises two or more of the plurality of characterizing parameters which characterize the state of the measurement environment at an i-th time period and the quality criterion associated with the two or more of the plurality of characterizing parameters at the i-th time period; and wherein the optimization unit is operable to execute at least some of the instructions to defer the measurement of the value to be measured if the quality criterion predicted by the trained machine learning model indicates that a threshold is not met.

22. The device of claim 21, wherein the optimization unit is further operable to cause the measurement of the value to be measured if the quality criterion predicted by the trained machine learning mode indicates that the threshold is met.

23. The device of claim 21, further comprising an optical system having a light source, at least one lens, and a detector configured to measure the element of the photolithography process.

24. The device of claim 23, wherein the computer system comprises an analysis unit operable to execute at least some of the instructions to analyze values measured by the optical system for determining characteristic variables of a statistical distribution of the measured values.

25. The device of claim 21, wherein the computer system comprises a non-volatile memory for storing at least one of: a machine learning model, a trained machine learning model, or characterizing parameters and assigned quality criteria used for training the machine learning model.

* * * * *

UNITED STATES PATENT AND TRADEMARK OFFICE
CERTIFICATE OF CORRECTION

| | | |
|---|---|---|
| PATENT NO. | : 12,307,334 B2 | Page 1 of 1 |
| APPLICATION NO. | : 17/140250 | |
| DATED | : May 20, 2025 | |
| INVENTOR(S) | : Dirk Seidel et al. | |

It is certified that error appears in the above-identified patent and that said Letters Patent is hereby corrected as shown below:

On the Title Page

<u>Page 2, Column 2 (item (56) Other Publications)</u>
Line 5, delete "J.C" and insert -- J.C. --

In the Specification

<u>Column 1</u>
Line 60, delete "DE 10 2007 047 092 B4" and insert -- DE 10 2007 047 924 B4 --

<u>Column 9</u>
Line 61, delete "$s_{i,N}(i)$" and insert -- $S_{j,N}(i)$ --

Signed and Sealed this
Fifth Day of August, 2025

Coke Morgan Stewart
*Acting Director of the United States Patent and Trademark Office*